United States Patent

Futatsugi et al.

[11] Patent Number: 5,827,075
[45] Date of Patent: Oct. 27, 1998

[54] ASSEMBLY OF AN ELECTRICAL CONNECTOR AND EJECTOR UNIT FOR CONNECTING IC CARDS TO PRINTED CIRCUIT BOARDS

[75] Inventors: Takashi Futatsugi, Tokyo; Ikuo Enomoto, Machida, both of Japan

[73] Assignee: The Whitaker Corporation, Wilmington, Del.

[21] Appl. No.: 604,062

[22] Filed: Feb. 20, 1996

Related U.S. Application Data

[62] Division of Ser. No. 118,373, Sep. 8, 1993, Pat. No. 5,503,564.

[51] Int. Cl.⁶ .................................................... H01R 9/09
[52] U.S. Cl. ............................. 439/79; 439/83; 439/751
[58] Field of Search ............................. 439/80–83, 79, 439/885, 741, 746, 747, 751

[56] References Cited

U.S. PATENT DOCUMENTS

| | | | |
|---|---|---|---|
| 4,826,442 | 5/1989 | Douty et al. | 439/83 |
| 4,932,885 | 6/1990 | Scholz | 439/79 |
| 5,051,101 | 9/1991 | Komatsu | 439/159 |
| 5,052,936 | 10/1991 | Biechler et al. | 439/60 |
| 5,139,435 | 8/1992 | Komatsu et al. | 439/159 |
| 5,145,389 | 9/1992 | Okubo | 439/159 |
| 5,149,276 | 9/1992 | Dixon | 439/159 |
| 5,179,505 | 1/1993 | Matsuo | 361/395 |
| 5,201,661 | 4/1993 | Ii | 439/79 |
| 5,201,665 | 4/1993 | McCardell, Jr. et al. | 439/157 |
| 5,203,725 | 4/1993 | Brunker et al. | 439/636 |
| 5,234,351 | 8/1993 | Dixon | 439/160 |
| 5,259,768 | 11/1993 | Brunker et al. | 439/60 |
| 5,259,793 | 11/1993 | Yamada et al. | 439/637 |
| 5,259,795 | 11/1993 | Yamada et al. | 439/751 |
| 5,389,001 | 2/1995 | Broschard, III et al. | 439/159 |

FOREIGN PATENT DOCUMENTS

| | | |
|---|---|---|
| 0S1790175 | 1/1972 | Germany . |
| 62-108480 | 5/1987 | Japan . |

OTHER PUBLICATIONS

*Journal of Electronic Engineering* No. 302, "IC Card Connectors Diversify as Technology Progresses"; Y. Kaku; pp. 38–41; Feb. 1992.

*Primary Examiner*—J. J. Swann

[57] ABSTRACT

An assembly for connecting an IC card to a printed circuit board includes a surface mounted connector and an ejector unit. The surface mounted connector has contacts arranged in an upper and a lower row at a narrow pitch to achieve a high degree of density of electronic components while maintaining high accuracy of contact positioning. Contacts are made by punching out from a metal sheet and have round contact sections for electrical connection with an IC card, termination sections with a portion for soldering connection to the printed circuit board, U-shaped retaining sections for insertion into contact holding openings of housing and supporting legs fitted in locking sections of the housing. The ejector unit is small but sufficiently strong and is simple to manufacture. It comprises a frame with left and right edges bent to form a guiding section wrapping around the side edges of the inserted IC card. Retaining members and a grounding contact for the card are also made by the same stamping operation.

2 Claims, 8 Drawing Sheets

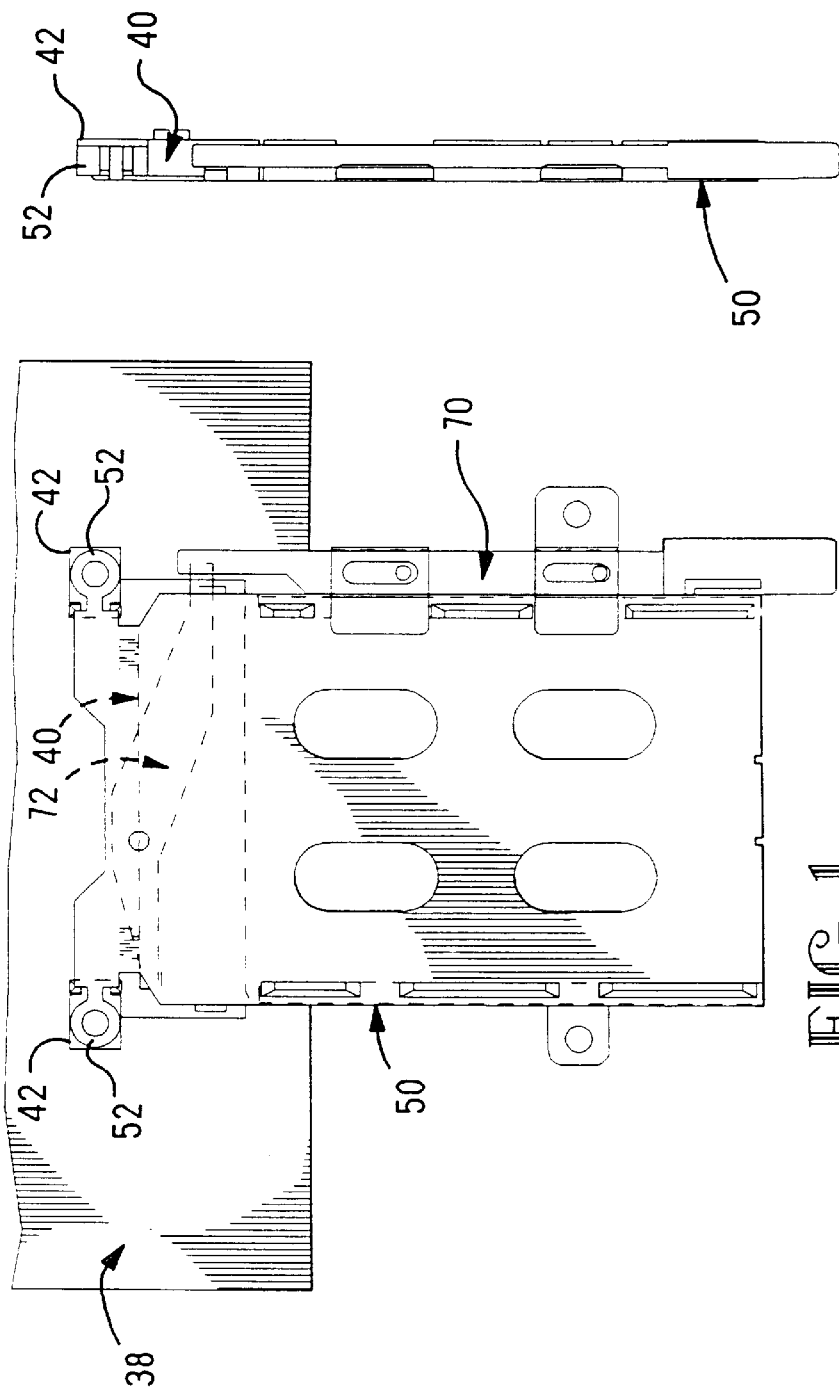

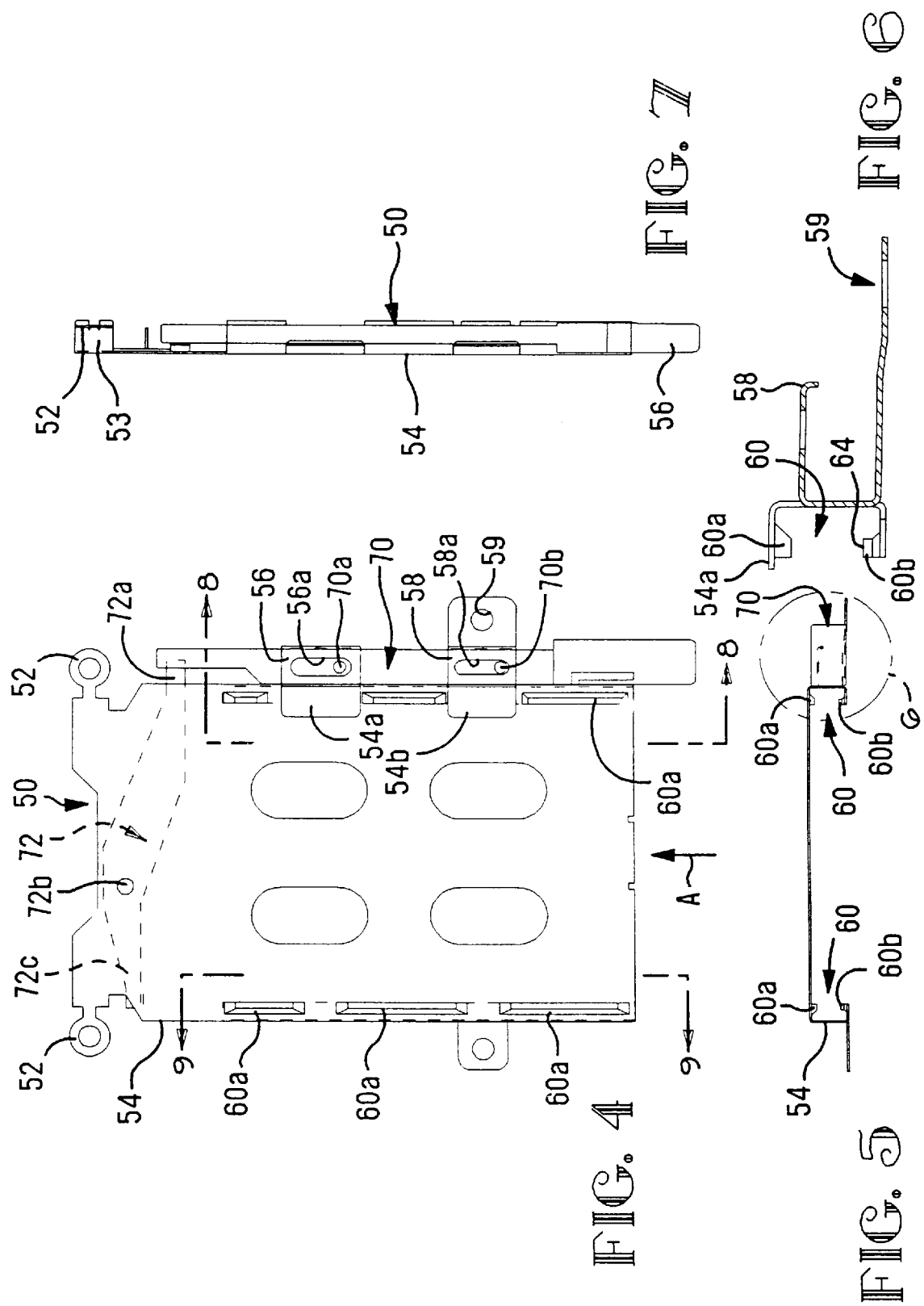

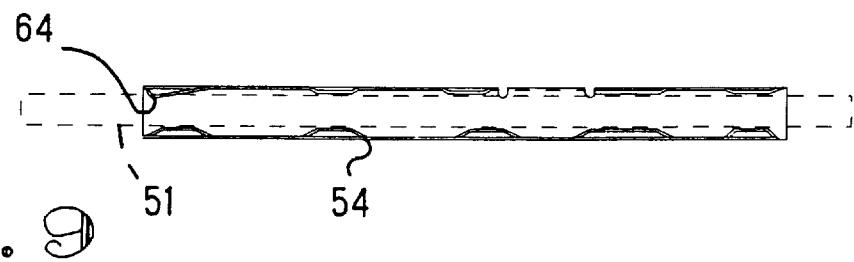
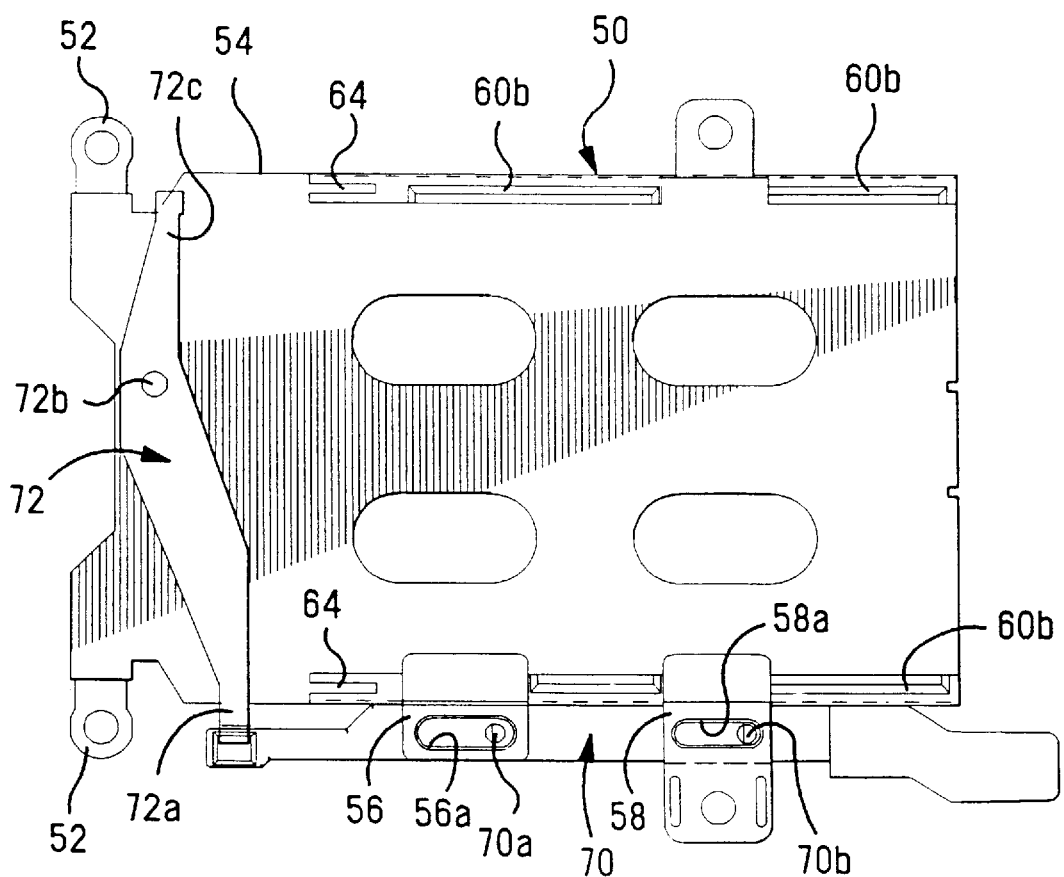

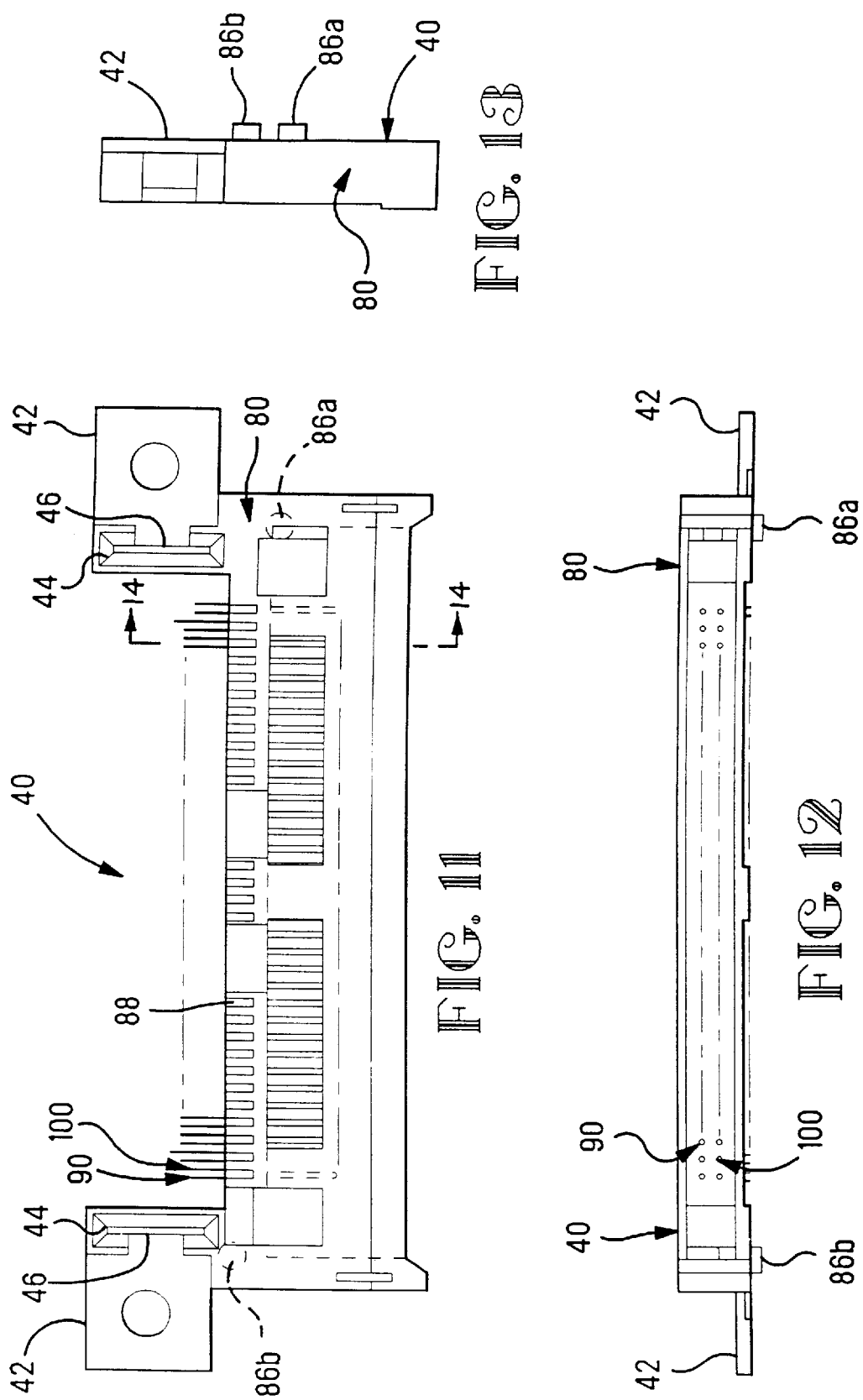

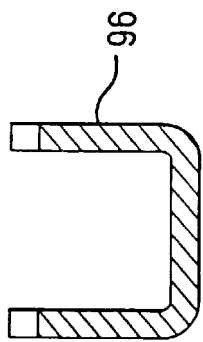
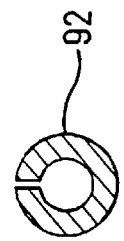
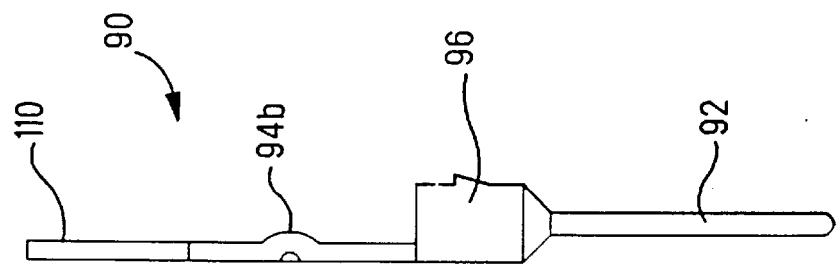
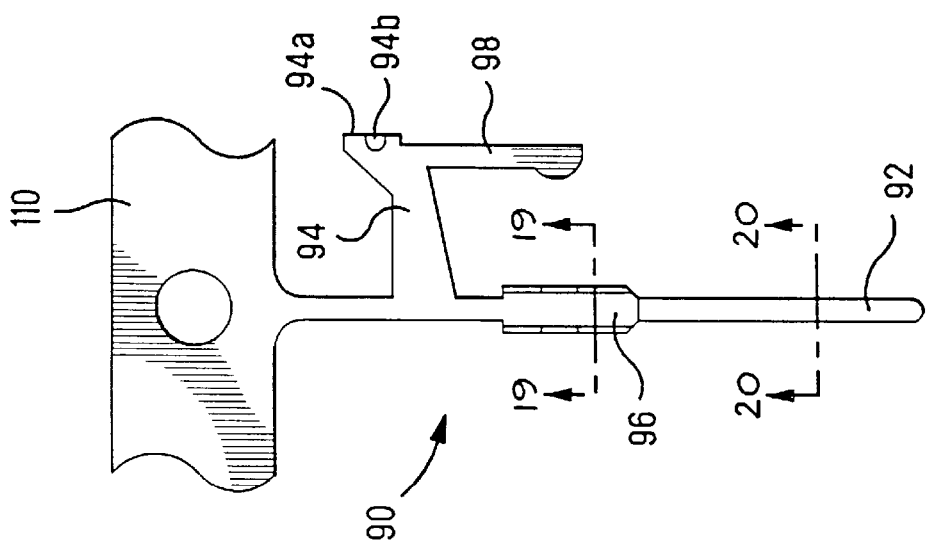

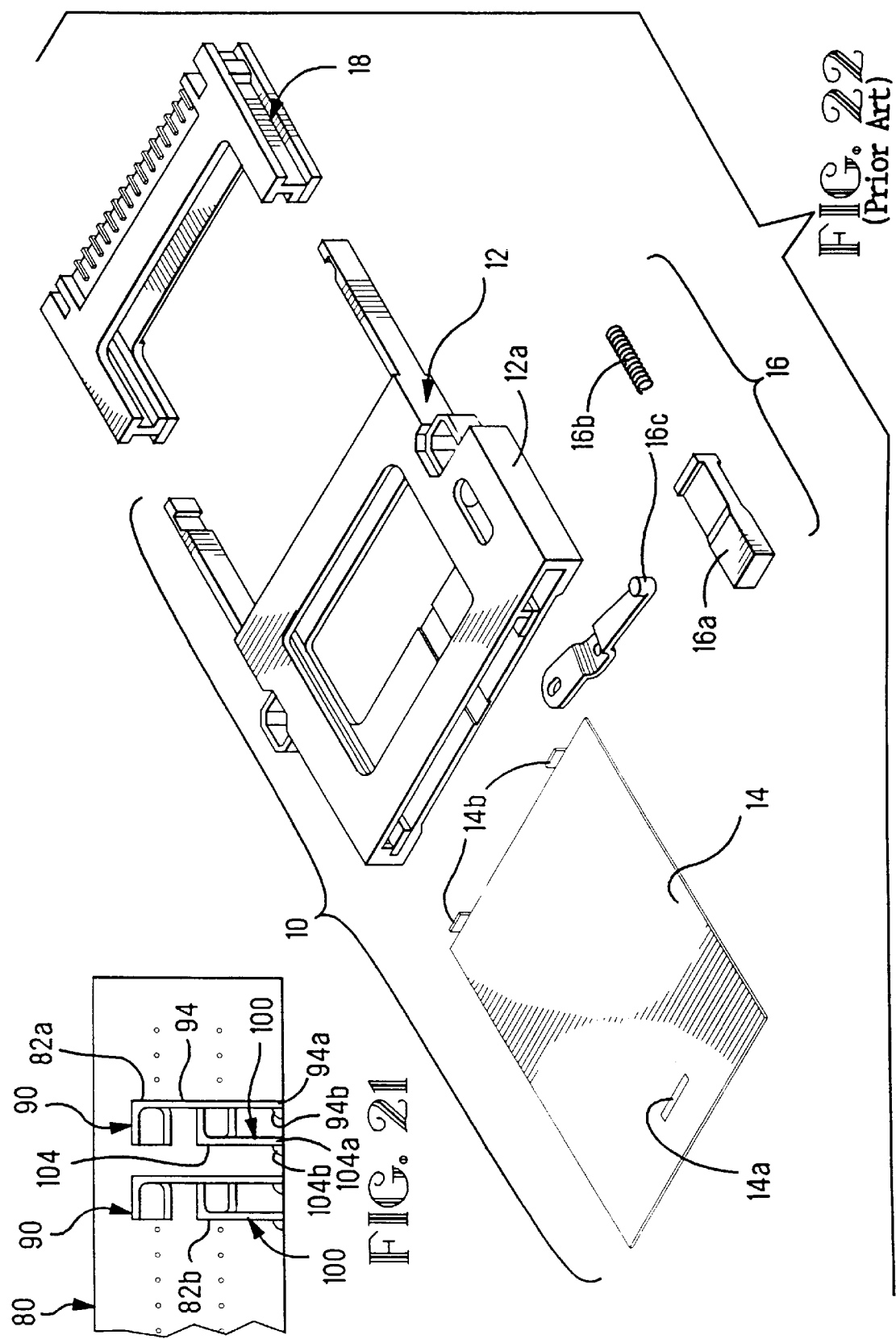

5,827,075

ASSEMBLY OF AN ELECTRICAL CONNECTOR AND EJECTOR UNIT FOR CONNECTING IC CARDS TO PRINTED CIRCUIT BOARDS

This application is a Divisional of application Ser. No. 08/118,373 filed Sep. 8, 1993, now U.S. Pat. No. 5,503,564.

FIELD OF THE INVENTION

This invention relates to an assembly for connecting flat cards, such as IC cards, especially those carrying memory ICs, to printed circuit boards, and particularly to an assembly that comprises a surface mounted connector for connecting the card to the board and an ejector unit for accepting the card.

BACKGROUND OF THE INVENTION

IC cards are widely used in personal computers, video games and other electronic devices. The storage potential of such IC cards has increased more than a hundred times compared to magnetic memories. In addition to memories, IC cards are also used in CPU's.

IC cards have multiple contacts in order to electrically connect them with terminals designed specifically for that purpose.

Special assemblies for IC cards usually comprise an ejector unit, whose purpose is to facilitate removal of the IC card inserted in the terminal, and a connector having contacts matching with those on the IC card. This connector is usually fixed to the printed circuit board of the special assembly for the IC card. The contacts of this connector are joined to the printed circuit board of the special assembly for the IC card, thus forming electrical connection between the IC card and the assembly for the purposes of information transmission.

FIG. 22 represents an exploded perspective view of a conventional ejector unit with a connector, as it is for example known from Japanese Publication No. 91-38772.

Ejector 10 consists of a frame 12 made of a plastic, a plate 14 to be inserted in the plastic frame 12 to which an IC card (not shown in the drawing) is attached, and an ejection device for ejection of the IC card inserted in the frame. The ejection device 16 consists of an operating bar 16a which is depressed when the user has to eject the IC card, spring 16b loading this operating bar 16a, and a cam bar 16c whose one end is connected to the operating bar 16a and the other end is connected to a projection 14a made on the plate 14. In addition, in order to retain the operating bar 16a of the ejection device 16 in the frame 12, a retaining device 12a is provided in the frame. Plate 14 has catches 14b intended for pushing the other end of the IC card during ejection. Thus, the conventional ejector unit consists of many parts, and its manufacturing is a complicated process. Another problem is that the frame is made of a plastic, and for sufficient strength it should be of substantial thickness, thus greatly reducing the possibility for miniaturization.

By connecting this ejector unit 10 to connector 18 and by inserting an IC card with a special connector (not shown in the drawing) attached to it, connection of the IC card to the printed circuit board is accomplished, as is for example shown in Japanese Publication No. 91-38772.

The connector has multiple contacts through which information is exchanged between the IC card and the special terminal for the IC card. These contacts are usually of the male type and are made in the form of a round pin. Therefore, soldering of the terminals to the printed circuit board requires almost the same area as the cross section of the round pins. Since an additional space for an insulating medium is required around the pins, their pitch is rather large.

It is a well known fact that introduction of integrated circuits gave impetus to an increased density of electronic components. IC cards, with integrated circuits as their main elements, are the best example of high density devices. As a result of these developments, IC cards appeared with pins arranged at a narrow pitch in one row. Thus, it became impossible to use connectors having round-type pins arranged at a wide pitch.

A method is known in the art making it possible to reduce the pitch of contacts in connectors by using contacts stamped from a flat metal sheet. These contacts are punched out from a metal sheet, and have surfaces remaining from the original metal sheet, the surfaces being formed in the process of punching. The advantage of these contacts is that they are arranged in a certain pattern in an insulating housing so that the surfaces remaining from the original metal sheet are facing each other, thus allowing for a rather narrow pitch between the contacts. Another advantage is that the contact termination sections are formed without bending and the pitch of their soldered connections is also narrow. An additional advantage is that soldering operations involve surfaces formed in the cutting or punching process which are free from spring forces, thus providing for a good quality of soldered connections, as it is disclosed in Japanese Publication No. 92-14382.

On the other hand, there are IC cards designed for data processing which have even higher density of electronic components. Such cards have contacts arranged in two rows, an upper and a lower row. The contacts stamped from a metal sheet described above are designed for arrangement in one row, however they cannot be used in a two-row arrangement because their termination sections will interfere with each other. Due to this disadvantage, these contacts cannot be used in IC cards that require two rows of contacts.

Connectors having two rows of contacts for use in IC cards, such as those shown in FIGS. 23 and 24, are known in the art, as it is for example described in Japanese Publication No. 86-194971.

In connector 20 shown in FIG. 23, contacts 22, 24 are arranged in pairs, one contact above the other. In order to avoid interference between termination sections 22a, 24a, contacts 22, 24 are bent in opposite directions so that their soldering locations on a printed circuit board (not shown in the Figure) are arranged in a straight line. In connector 30 shown in FIG. 24, contacts 32, 34 are also arranged in pairs, one contact above the other. In order to avoid interference between termination sections 32a, 34a, contacts 32, 34 are bent in such a manner that their soldering locations on a printed circuit board (not shown in the Figure) are arranged in a zig-zag pattern. Attempts were made to use contacts punched out from a metal sheet in the connectors of the type shown in FIGS. 23, 24, but it was necessary to bend the contacts as in the above examples.

In the connectors intended for the use with IC cards having upper and lower rows of contacts, the contacts are usually bent downward.

In connector 20 shown in FIG. 23, termination sections 22a, 24a are arranged in such a manner that they form a single row on the circuit board, and because, in addition to the area occupied by the termination sections, a distance is left between them for insulation purposes, the contact pitch is rather large. This prevents achieving a high density of components arranged on printed circuit boards.

In connector 30 shown in FIG. 24, termination sections 32a, 34a are arranged in a zig-zag pattern which makes it possible to make the contact pitch slightly narrower than in the case of connector 20 shown in FIG. 23. However, this leads to a more complicated pattern on the printed circuit board. In addition, contacts of both connector 20 and connector 30 are made by stamping from a metal sheet, and their termination sections are bent downward. Because of this, residual mechanical stress in the contacts can result in an uneven position of the ends of the termination sections relative to the surface of the soldering connection which ultimately can lead to a defective soldering or undesirable connections between adjacent contacts.

Accordingly, it is an object of the invention to provide an assembly for connecting an IC card to a printed circuit board, the assembly comprising a surface mounted connector with contacts arranged at a narrow pitch in upper and lower rows for connection to cards making it possible to achieve a high density of electronic components and a reliable soldering connection to printed circuit boards. The invention further comprises an ejector unit which is simple in manufacture and, at the same time, has sufficient strength and relatively small dimensions.

SUMMARY OP THE INVENTION

In order to solve the above-mentioned problems, the assembly for connecting an IC card to a printed circuit board according to this invention includes a surface mounted connector and an ejector unit comprising the following features: the surface mounted connector has multiple contacts punched out from a single metal sheet, and a housing having contact holding openings arranged in two rows to accommodate and retain these multiple contacts, wherein the multiple contacts have U-shaped retaining sections fitting in the contact holding openings of the upper and lower rows with the openings of the U-shaped sections oriented horizontally in opposite directions for the contacts of the upper and lower rows, contact sections forming electric connection with the contacts of a mating connector, and integral termination sections made from the same metal sheet extending downward from the retaining sections used for connection to the printed circuit board. The ejector unit has a frame into which a thin flat card is inserted whose surface is covered, at least partly, by metal, an operating bar movable in the direction of the card insertion and a cam bar whose one end is connected to the operating bar and whose center is pivotally mounted to the frame so that the cam bar can turn around it, and whose other end ejects the card inserted in the frame when the operating bar is pushed in, wherein the frame has a guiding section facilitating the card insertion which is formed by bending the edges of the frame during its formation by stamping from a metal sheet thereby being in the shape of shoulders wrapped around the sides of the card, and wherein the frame has a retaining section for the operating bar integral with the frame which is made when the frame is stamped from the metal sheet.

The contacts of the surface mounted connector according to this invention are made by punching out from the metal sheet and their retaining sections fitting in the contact holding openings of the housing are bent to a U-shaped configuration with the U-shaped configuration of the upper row contacts and the lower row contacts being oriented horizontally in opposite directions. Since the termination sections of the contacts are made from the same metal sheet and extend downward from the retaining sections, the contact pitch can be made narrow. Due to the fact that only the retaining sections are bent to a U-shaped configuration and the termination sections do not have to be bent, no residual mechanical stress is present in the termination sections, thus assuring an accurate and regular pitch of the termination sections.

Both the guiding section and the retaining section of the frame of the ejector unit according to this invention are made by plastic molding; whereas the frame is made by stamping from a single metal sheet. This makes it possible to reduce the number of parts, to simplify the manufacturing process and to achieve the same strength as units made of plastic at smaller dimensions.

BRIEF DESCRIPTION OF THE DRAWINGS

The invention will now be described by way of example with reference to the accompanying drawings in which:

FIG. 1 is a top plan view showing an assembly of an ejector unit attached to a surface mounted connector fixed to a printed circuit board;

FIG. 2 is a front view of the assembly of FIG. 1;

FIG. 3 is a side view of the assembly of FIG. 1;

FIG. 4 is a plan view of the ejector unit;

FIG. 5 is a front view of the ejector unit of FIG. 4;

FIG. 6 is an enlarged detail of FIG. 5;

FIG. 7 is a side view of the ejector unit of FIG. 4;

FIG. 8 is a view taken along the line 8—8 of FIG. 4;

FIG. 9 is a view taken along the line 9—9 of FIG. 4;

FIG. 10 is a bottom view of the ejector unit;

FIG. 11 is a plan view showing a surface mounted connector;

FIG. 12 is a front view of the connector of FIG. 11;

FIG. 13 is a side view of the connector of FIG. 11;

FIG. 17 is a front view illustrating the bending of the contacts shown in FIGS. 15 and 16;

FIG. 18 is a side view illustrating the bending of the contacts shown in FIGS. 15 and 16;

FIG. 19 is a view taken along the line 19—19 of FIG. 17;

FIG. 20 is a view taken along the line 20—20 of FIG. 17;

FIG. 21 is a back view of the insulating housing with inserted contacts;

FIG. 22 is an exploded perspective view of a conventional ejector unit and connector;

DETAILED DESCRIPTION OF THE INVENTION

Figure 14:
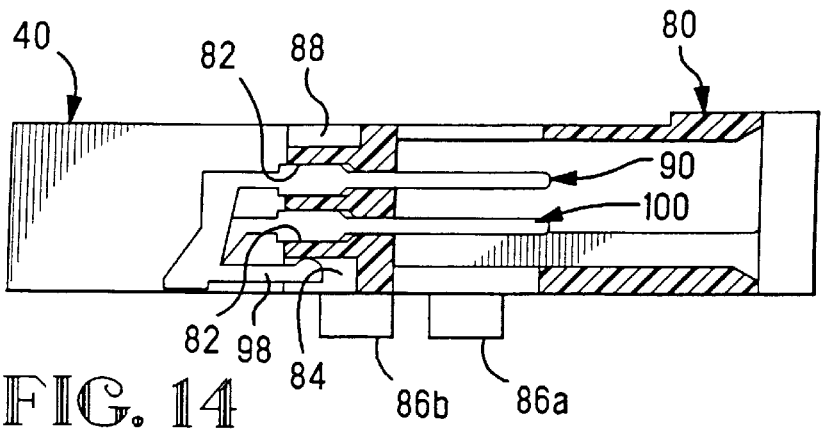
FIG. 14 is a view taken along the line 14—14 of the connector of FIG. 11.

FIGS. 1 to 3 represent a surface mounted connector attached to a printed circuit board with an ejector unit fixed to it. FIG. 1 is a plan view, FIG. 2 is a front view, and FIG. 3 is a side view of the assembled connector and ejector unit.

The surface mounted connector 40 has mounting lugs 42 through which it is attached to a printed circuit board 38 by means of mounting screws. A groove 46 (see FIG. 11) having a positioning tapered section 44 is provided in the surface mounted connector 40 for an accurate connection of the ejector unit 50 thereto. For the purposes of fixing the ejector unit 50 on the printed circuit board 38 and of connecting ground members of the ejector unit 50 and the printed circuit board 38, rings 52 are provided on the ejector unit 50. Therefore, after soldering the surface mounted connector 40 to the printed circuit board 38, the ejector unit 50 is accurately positioned by inserting it in the grooves 46 with the tapered sections 44, the rings 52 are aligned with the mounting lugs 42, and the assembly is fixed to the printed circuit board 38 by means of screws, thus securing the ejector unit 50 on the surface mounted connector 40.

Below, the design of the ejector unit 50 is explained, referring to FIGS. 4 to 10.

FIGS. 4 to 7 represent an overall depiction of ejector unit 50, where FIG. 4 is a plan view, FIG. 5 is a front view, FIG. 6 is an enlarged detail of FIG. 5, and FIG. 7 is a side view of ejector unit 50. FIG. 8 is a cross-sectional view taken along the line 8—8 of FIG. 4; FIG. 9 is a cross-sectional view taken along the line 9—9 of FIG. 4 with an inserted IC card. FIG. 10 is a bottom view of ejector unit 50.

The ejector unit 50 comprises a frame 54 into which an IC card 51 is inserted and an operating bar 70 secured in the frame 54 in the direction of the IC card 51 insertion (shown by arrow A) with a cam bar 72 connected to one end of the operating bar 70.

Frame 54 is formed by stamping from a metal sheet, and it has, in the areas 54a and 54b shown in FIGS. 4 and 6, cut-outs bent outside which form sections 56, 58 retaining the operating bar 70. These retaining sections 56, 58 have openings 56a and 58a into which projections 70a, 70b of the operating bar 70 are inserted limiting movement of the operating bar within specified limits. Retaining section 58 has a hole 59 for connection of the frame 54 by a screw to circuit board 38.

Left and right sides of frame 54 are bent in such a manner as to form a guiding or retaining section 60 for the IC card 51. At the edges of these guiding sections 60, two rails 60a and 60b facing each other are formed by pressing part of the frame inwardly. The function of these rails is to direct both edges of the IC card along the frame 54. Because of these rails 60a and 60b being provided in the retaining sections 60, the frame can accommodate two types of IC cards: those with an even cross section and those whose cross section is narrower at the sides. In addition, the retaining section 60 has a grounding contact 64 provided in the direction of the IC card insertion. The function of this grounding contact 64 is to remove static charge from the metal surface of the IC card. Static charge is diverted via the grounding contact 64 and ring 52 to the grounding bus bar of the printed circuit board 38. Such an arrangement prevents circuits of the IC card from damage by static charges accumulated on the metal surface. The grounding contact 64 practically is not affected by friction against metal surfaces of the IC cards since the travel distance of the IC cards is short.

As mentioned above, operating bar 70 is equipped with projections 70a and 70b which are disposed in openings 56a and 58a respectively. Therefore, the operating bar 70 is reliably retained by retaining sections 56, 58 formed in the frame 54 and can move in the direction of insertion of the IC card. To the front end (in the direction of insertion) of operating bar 70, an end 72a of cam bar 72 is connected, and the central part of cam bar 72 is fixed by a pivot pin 72b to frame 54. Therefore, when operating bar 70 is pushed in the direction of insertion (direction of arrow A), the opposite end 72c of cam bar 72 pushes the IC card out that has been inserted in frame 54.

As mentioned above, ejector unit 50 comprises only frame 54 made of a metal sheet, an operating bar 70 retained in the retaining sections 56, 58 which are an integral part of the frame 54, and a cam bar 72 designed to eject an IC card inserted in the frame 54. Because of the small number of parts, the cost of materials for this ejector unit is comparatively low. Since the frame is made of a metal, it can be made thinner and smaller than a plastic frame of a similar strength. The fact that the retaining sections 56 and 58 are made as integral part of the frame 54 also contributes to the small dimension of the unit.

As can be seen from FIG. 1, the ejector unit 50 attached to the surface mounted connector 40 fixed on the printed circuit board 38, extends rather far beyond the boundaries of the printed circuit board 38, thus becoming an obstacle to soldering operations. Since frame 54 is made of metal, it is highly heat absorbent. Therefore, it is desirable to be able to attach the ejector unit 50 to the surface mounted connector 40 after the latter has been fixed to the printed circuit board 38 by soldering. The ejector unit 50 according to this embodiment can be attached to the surface mounted connector 40 after the latter has been soldered to the printed circuit board 38 precisely in the required position by inserting sections 53 into the grooves 46 via tapered sections 44. This design makes it possible to easily solder the surface mounted connector 40 to the printed circuit board 38, thus considerably reducing assembly costs and making it suitable for mass production.

Below, the surface mounted connector 40 is described with reference to FIGS. 11, 12, 13 and 14.

FIGS. 11, 12 and 13 are a schematic representation of a surface mounted connector whereby, FIG. 11 is a plan view, FIG. 12 is a front view and FIG. 13 is a side view. FIG. 14 is a cross-sectional view taken along line 14—14 of FIG. 11.

The surface mounted connector 40 comprises an insulating housing 80 and two parallel rows of contacts; an upper row of contacts 90 and a lower row of contacts 100.

As mentioned above, the insulating housing 80 has mounting lugs 42 and grooves 46 with positioning tapered sections 44. Housing 80 also has two parallel rows of contact holding openings 82 for contacts 90 and 100. There are also locking sections 84 provided to hold, by means of friction, support legs 98 and 108 (see FIGS. 15 and 16) of the contacts 90 and 100. Housing 80 also has position determining bosses 86a and 86b intended for a correct positioning of the connector during its mounting to the printed circuit board. Above the holding openings 82, depressions 88 are formed to increase precision of the contact holding openings 82.

Referring to FIGS. 15 to 21, the method of securing contacts 90 and 100 in the insulating housing 80 will now be described.

Figure 15:
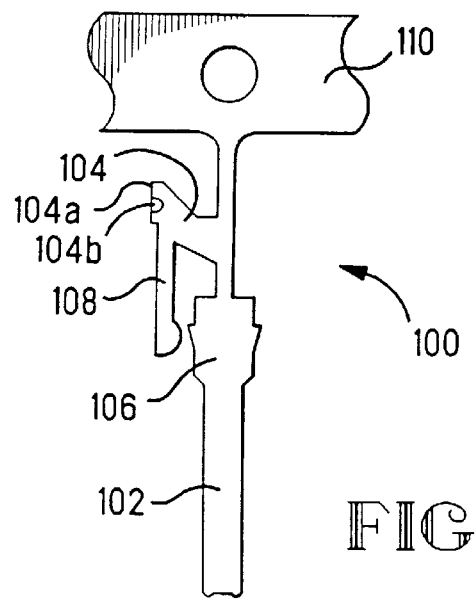
FIG. 15 is a plan view of contacts for the lower row stamped from a metal sheet.
Figure 16:
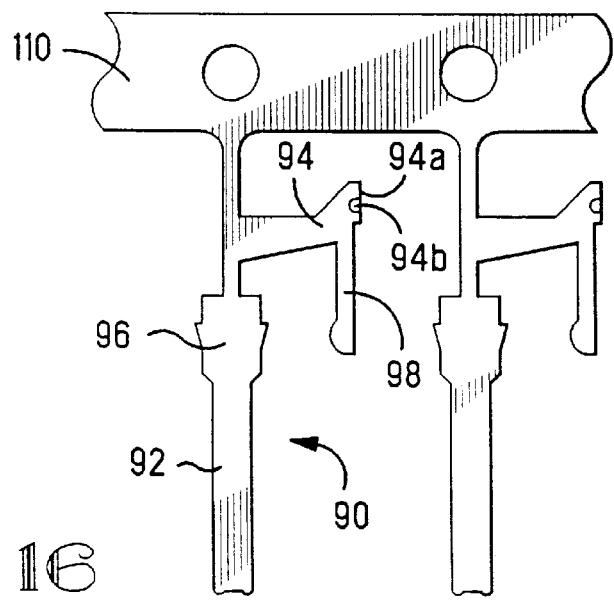
FIG. 16 is a plan view of contacts for the upper row stamped from a metal sheet.

FIG. 15 is a plan view of a stamping for the manufacture of contacts 100, and FIG. 16 is a plan view of a stamping for the manufacture of contacts 90. FIGS. 17 to 20 represent contacts bent to their final shape from the semifinished parts shown in FIGS. 15 and 16. FIG. 17 is a front view, FIG. 18 is a side view, FIG. 19 is a cross-sectional view taken along the line 19—19 in FIG. 17, and FIG. 20 is a cross-sectional view taken along the line 20—20 in FIG. 17.

Contacts 90 and 100 are made of an especially thin metal sheet, so that it is possible to bend their contact sections 92 and 102 to assume a round configuration in cross section. However, since the only difference between contacts 90 and 100 is the length of their termination sections, the explanation is given mostly with respect to contact 90.

First of all, contacts 90 stamped from a metal sheet and bent to an appropriate configuration have a contact section 92 extending forward to provide an electrical connection with the IC card, termination sections 94 intended for connection to the printed circuit board 38 (see FIG. 1) by means of soldering, a retaining section 96 intended for securing the contacts in the contact holding openings 82 (see FIG. 14) and support legs 98 to be inserted in the locking sections 84 (see FIG. 14) of the housing 80. In order to prevent mishandling of stamped out contacts during subsequent operations, they remain connected to a carrier strip 110. Then, the retaining section 96 is bent to a U-shape, as shown in FIG. 19, with the legs being perpendicular to the plane of the drawing in FIGS. 15 and 16, and finally the contact section 92 is bent to a tubular shape, as shown in FIG. 20, in the same direction as the retaining section 96. In the center of soldering portion 94*a* of the contact 90, which is intended for soldering, a bead 94*b* is formed. The reason for forming such a bead is that it is necessary to obtain a reliable soldered connection of the contact with the conductive pad of the printed circuit board even if the contact is not precisely aligned with the pad due to temperature deformation or accumulated errors in manufacturing. Since contact 90 is made of an especially thin metal sheet, there is a danger that, as a result of temperature deformation or accumulated errors in manufacturing, the soldering portion 94*a* of the termination section 94 may fail to form a connection with the conductive pad on the printed circuit board 38. Therefore, bead 94*b* is formed in the center of the soldering portion 94*a* to prevent defective connections. The formation of the bead is equivalent to increasing the thickness of the metal sheet, thus increasing the space available for soldering.

Retaining section 106 and contact section 102 of contact 100 shown in FIG. 15 are also bent upward similar to retaining section 96 and contact section 92 of contact 90.

Contacts 90 and 100 with their retaining and contact sections are formed according to the above description. FIG. 21 is a schematic diagram showing the back view of the insulating housing 80 with contacts 90 and 100 inserted in it.

Figure 23:
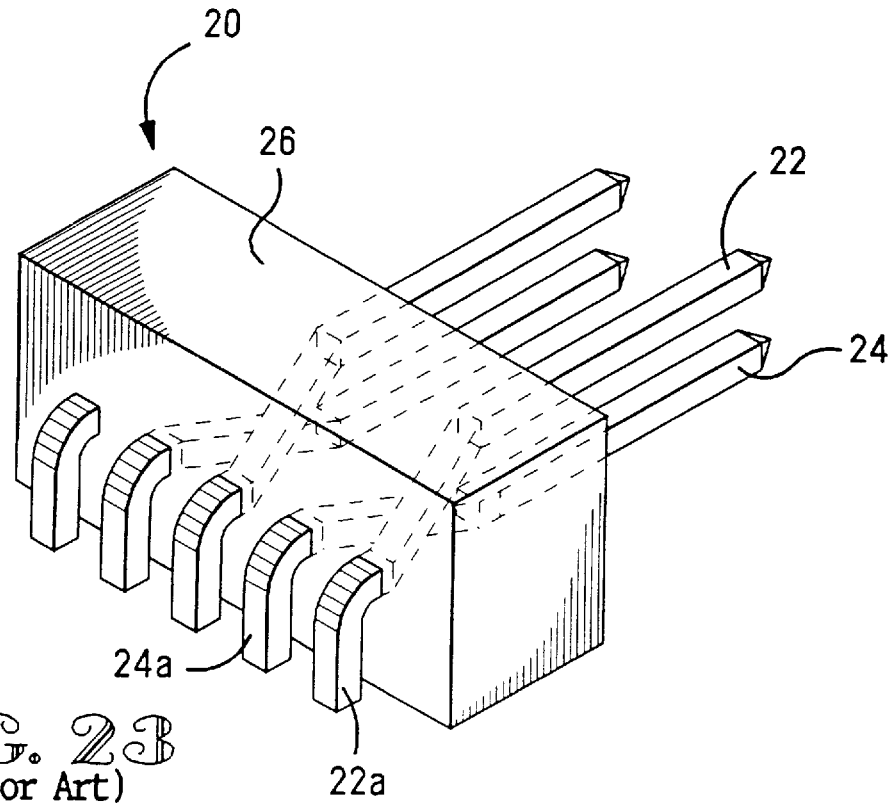
FIG. 23 is a perspective view of a conventional connector for mounting on a printed circuit board having upper and lower rows of contacts.
Figure 24:
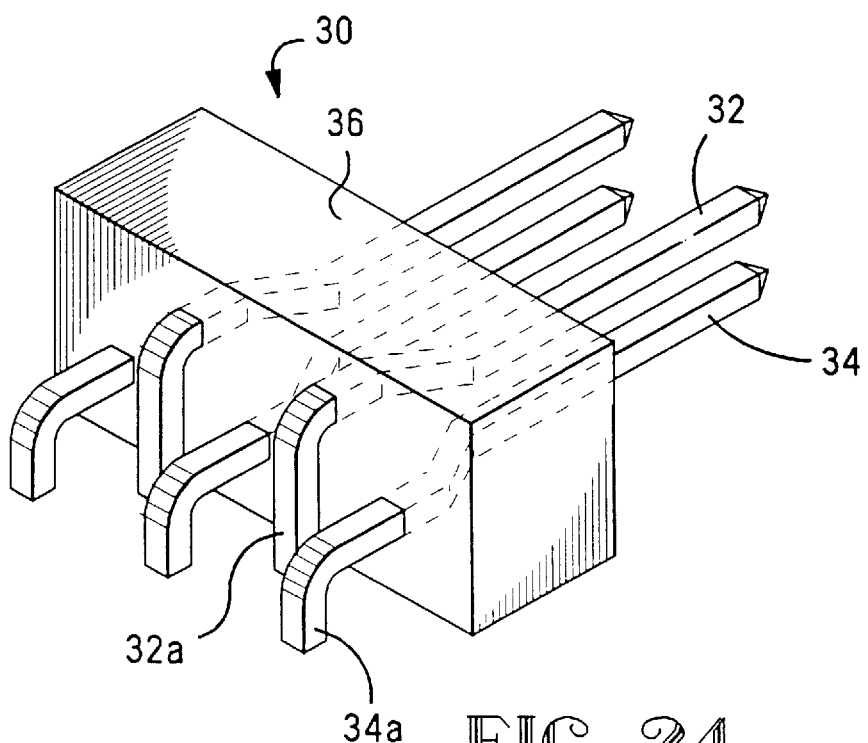
FIG. 24 is a perspective view of another conventional connector for mounting on a printed circuit board having upper and lower rows of contacts.

Contacts 90 and 100 are inserted in the contact holding openings 82 (see FIG. 14) of the insulating housing 80 so that the openings of the U-shaped retaining sections 96 and 106 are oriented horizontally in opposite directions for contacts 90 and 100, i.e. facing each other, and termination sections 94 and 104 are separated from one another. This makes it possible to shorten the pitch of the contacts in the row. Since the retaining sections 96 and 106 are not bent relative to corresponding termination sections 94 and 104, they are arranged at the same pitch as the contacts in a straight line on the base board aligned with the sides 82*a* and 82*b* of the contact holding openings 82. This helps not only to prevent misalignment of the soldering portions 94*a*, 104*a* due to shifting caused by elastic deformation and residual mechanical stress produced by the bending (see FIGS. 23, 24) but also to maintain precise pitch of the contacts. Support legs 98, 108 of the contacts 90, 100 are inserted in the locking sections 84 of housing 80 (see FIG. 14) where they are retained by friction. This provides an additional prevention measure against pitch shift in the arrangement of contacts 90, 100 and makes it possible to achieve even higher density of contacts.

In the above embodiment, the contact sections 92, 102 of contacts 90, 100 were of the male type, however this invention is not limited to connectors with only male contacts, but covers connectors with female contacts as well.

The surface mounted connector according to this invention has contacts arranged in two rows (upper and lower rows) which are made without bending operations that can result in shifting of the pitch of the soldering connection portions. Since the termination sections are made in such a manner that their surfaces remaining from the original metal sheet are facing each other, the pitch of the contacts can be reduced without affecting the accuracy of the positioning of the termination sections on the printed circuit board.

The frame of the ejector unit according to this invention is made by stamping from a metal sheet with the guiding section and the retaining section being subsequently made by a deformation method. Such a method of production results in a smaller number of parts and a simpler manufacturing process, and makes it possible to produce smaller and lighter units having the same strength as larger conventional ejector units made of plastic.

We claim:

1. An electrical connector for surface mounting onto a circuit board, comprising:

an insulating housing having upper and lower rows of contact retaining openings; and upper row and lower row contacts made by stamping from a metal sheet, each of said contacts having a horizontal contact section disposed in said insulating housing, a retaining section secured in a respective one of said contact retaining openings and a planar termination section extending downwardly toward a board engaging surface outside a rear surface of said housing, said termination section having a connection portion at said board engaging surface for electrical connection to a respective conductive area on the circuit board;

said termination section including a support leg extending therefrom proximate said board engaging surface, said leg extending substantially parallel to said board and toward said housing, said leg having a free end adapted to engage a locking section within said housing thereby assuring precise positioning of said termination section;

wherein said upper and lower row contacts are essentially identical except in the length of the termination sections reaching the conductive areas on the circuit board.

2. The electrical connector of claim 1 wherein said termination section has a bead therein.

* * * * *